United States Patent [19]

Nagasawa

[11] Patent Number: 5,304,870
[45] Date of Patent: Apr. 19, 1994

[54] SOURCE ELECTRODE-CONNECTED TYPE BUFFER CIRCUIT HAVING LDD STRUCTURE AND BREAKDOWN VOLTAGE PROTECTION

[75] Inventor: Hironori Nagasawa, Yokohama, Japan

[73] Assignee: Kabushiki Kaisha Toshiba, Kawasaki, Japan

[21] Appl. No.: 846,162

[22] Filed: Mar. 5, 1992

[30] Foreign Application Priority Data

Mar. 6, 1991 [JP] Japan .................................. 3-40153

[51] Int. Cl.⁵ .................. H03K 19/017; H03K 19/094
[52] U.S. Cl. ..................................... 307/448; 307/450
[58] Field of Search ....................... 307/448, 450, 455; 257/356, 336, 339, 344, 487

[56] References Cited

U.S. PATENT DOCUMENTS

| | | | |
|---|---|---|---|
| 4,044,373 | 8/1977 | Nomiya et al. | 257/356 |
| 4,736,117 | 4/1988 | Wieser | 307/448 |
| 4,968,904 | 11/1990 | Yamashita et al. | 307/448 |
| 5,083,046 | 1/1992 | Nagasawa | 307/448 |
| 5,128,556 | 7/1992 | Hirakata | 307/448 |

OTHER PUBLICATIONS

Chen, John Y.; "CMOS Devices and Technology For VLSI", ©1990 by Prentice-Hall, Inc.; pp. 199-210.

*Primary Examiner*—Edward P. Westin
*Assistant Examiner*—Benjamin D. Driscoll
*Attorney, Agent, or Firm*—Finnegan, Henderson, Farabow, Garrett & Dunner

[57] ABSTRACT

A buffer logic circuit having a lightly doped drain structure, comprising a power source potential, a ground potential, first and second Field Effect Transistors having drain electrodes, gate electrodes supplied with first input signal and a second input signal, respectively, source electrodes being connected to each other, and the drain electrodes for generating output signals corresponding to the input signals, respectively, device, having an end connected to the source electrodes of the first and second FETs, for reducing the potential of the drain electrodes, and device, connected between the other end of the drain electrode potential reducing device and the ground potential, for supplying a constant-current regulated power.

8 Claims, 3 Drawing Sheets

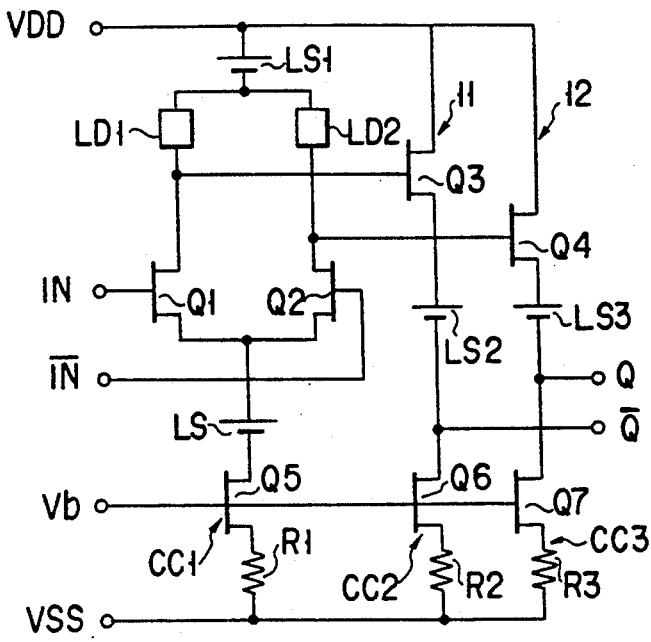
F I G. 1
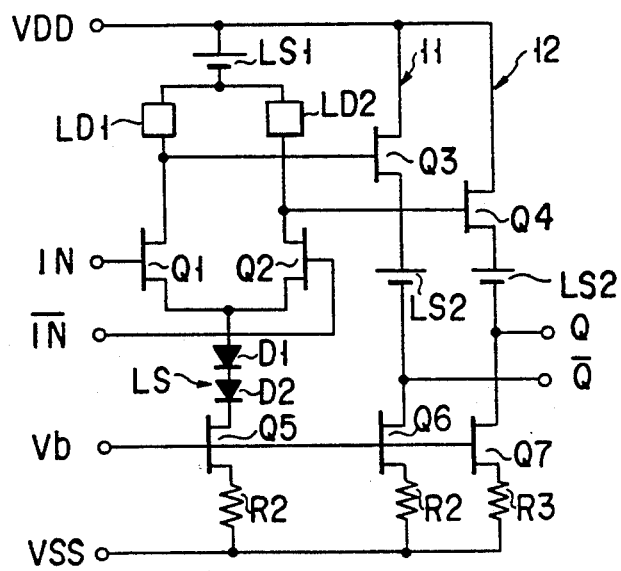
F I G. 2

SOURCE ELECTRODE-CONNECTED TYPE BUFFER CIRCUIT HAVING LDD STRUCTURE AND BREAKDOWN VOLTAGE PROTECTION

BACKGROUND OF THE INVENTION

1. Field of the Invention

This invention relates to a source electrode-connected type logic circuit (SCFL) employing a field effect transistor, and more particularly to an SCFL for use in a high frequency digital circuit.

2. Description of the Related Art

A buffer circuit for use in a digital circuit which must operate at high frequency, such as a multiplexer for optical communication or a divider for satellite broadcast, has a source coupled FET logic circuit (SCFL) of a LDD (Lightly Doped Drain) structure made of GaAs. The reason why the buffer circuit has the LDD structure is that the structure enhances high frequency characteristics thereof.

The LDD structure, however, makes it difficult to broaden the distance between the gate and drain, thereby reducing the breakdown voltage of the circuit. For example, a circuit of a non-LDD structure has a breakdown voltage of 6-10V or more, whereas a circuit of the LDD structure has a breakdown voltage of approximately 4V. Further, in recent years, power consumption has been required to be reduced.

SUMMARY OF THE INVENTION

It is the object of the invention to provide a source coupled FET logic circuit (SCFL) of small power consumption which is free from current leakage from drain to gate thereof.

To attain the above object, the logic circuit has a lightly doped drain structure, and comprises: a power source potential (VDD); a ground potential (VSS); first and second Field Effect Transistors (Q1, Q2) having drain electrodes, gate electrodes supplied with a first input signal (IN) and a second input signal ($\overline{\text{IN}}$), respectively, source electrodes being connected to each other, wherein the drain electrodes generate output signals corresponding to the input signals, respectively; means (LS), having an end connected to the source electrodes of the first and second FETs (Q1, Q2), for reducing the potential of the drain electrode of Q5; and means (Q5, R1), connected between the other end of the drain electrode potential reducing means (LS) and the ground potential (VSS), for supplying a constant-current regulated power.

By virtue of the above structure, the drain electrode potential of Q5 can be reduced by the drain electrode potential reducing means (LS) circuit, thereby reducing a potential applied to the constant-current regulated power supply means (Q5, R1) having a low breakdown voltage, and restraining current leakage at the power supplying means (Q5, R1), resulting in saving power in the circuit.

Additional objects and advantages of the invention will be set forth in the description which follows and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 1 is a circuit diagram, showing an embodiment of the invention;

FIG. 2 is a circuit diagram, showing another embodiment of the invention;

DETAILED DESCRIPTION OF THE PREFERRED EMBODIMENTS

Figure 3:
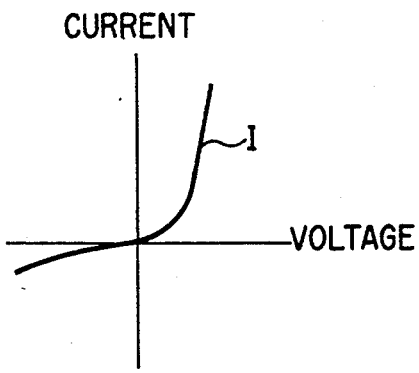
FIG. 3 is a graph, showing a static characteristic of a Schottky diode.

The invention will be explained with reference to the accompanying drawings showing embodiments thereof.

In FIG. 1, transistors Q1 and Q2 perform differential operations. Reference numeral VDD denotes a high potential power source, VSS a low potential power source, Q1-Q4 FETs, LD1 and LD2 load elements, LS1-LS3 level shift elements, IN and $\overline{\text{IN}}$ input signals having phases opposite to each other, and Q and $\overline{\text{Q}}$ output signals. Reference numerals 11 and 12 each denote a buffer/level-shift circuit. Constant current sources are designated by combinations Q5-Q7 resistors R1-R3.

Note the voltage between the gate and source of a transistor when the present invention is not used. If there are no noise reduction level shift elements LS shown in FIG. 1, then the drain voltage Vd1 of the transistor Q5 is expressed by the following equation:

$$Vd1 = V_H - Vgs \qquad (1)$$

where $V_H$ represents a higher one of the gate potentials of the transistors Q1 and Q2, and Vgs a voltage between the source and gate of a transistor having the higher potential $V_H$ (the potential of the source is a reference value).

The voltage flowing across a constant-current source (here transistor Q5 and R1) is determined on the basis of not only a voltage between the gate and source of the transistor Q5 but also a voltage between the drain and source thereof. If the voltage between the drain and source is high, too much current flows through the transistor, so that low power consumption cannot be achieved.

Where the transistor is metal-semiconductor junction type, i.e., it comprises a MESFET, an inverse direction current I flows from the drain to the gate, as is shown in FIG. 3. This current causes a noise which adversely affects the circuit. In a case where the invention is not applied, the ratio of noise current to consumption current is reduced by increasing the amount of current supplied from VDD. In other words, the noise current interrupts a reduction in the consumption current.

The embodiments of the invention will now be explained. As is shown in FIG. 1, the source electrodes of the transistors Q1 and Q2 are connected to each other.

The drains of transistors Q1 are connected to each other via loads LD1 and LD2, respectively, and then connected to the power source VDD via a level shift element LS1. A level shift element LS is connected between the common connection of the source electrodes and the drain of the transistor Q5 serving as a regulated constant current supply source, and the other end of the constant-current regulated power supply Q5 is connected to the power source VSS. The drains of the transistors Q1 and Q2 are connected to buffer level-shift circuits 11 and 12, respectively.

The circuit of FIG. 1 is constructed such that the level shift element LS is interposed between the common connection of the source electrodes of the transistors Q1 and Q2 performing differential operations, and the drain of the transistor Q5 serving as a constant current source. When a voltage applied across the both ends of the element LS is ΔV, the drain potential Vd2 of the transistor Q5 is given by $$Vd2 = VH - Vgs - \Delta V \quad (2)$$

Accordingly, the drain potential of the transistor Q5 employed in the invention is smaller by ΔV than that obtained from the conventional circuit and given by the equation (1).

The potential Vd2 can be further reduced by employing a plurality of level shift elements in place of a single level shift element.

FIG. 2 shows another embodiment in which the level shift element LS consists of a forward direction circuit comprising Schottky diodes D1 and D2. By virtue of the diodes, the influence of a resistance per unit area is relatively small. Further, variations in resistance fall within a relatively narrow range, i.e., there occur variations of 20% or more in the case of using ordinary resistors, whereas there occur variations of approx. 10% in the case of using forward current of diodes.

Figure 5:
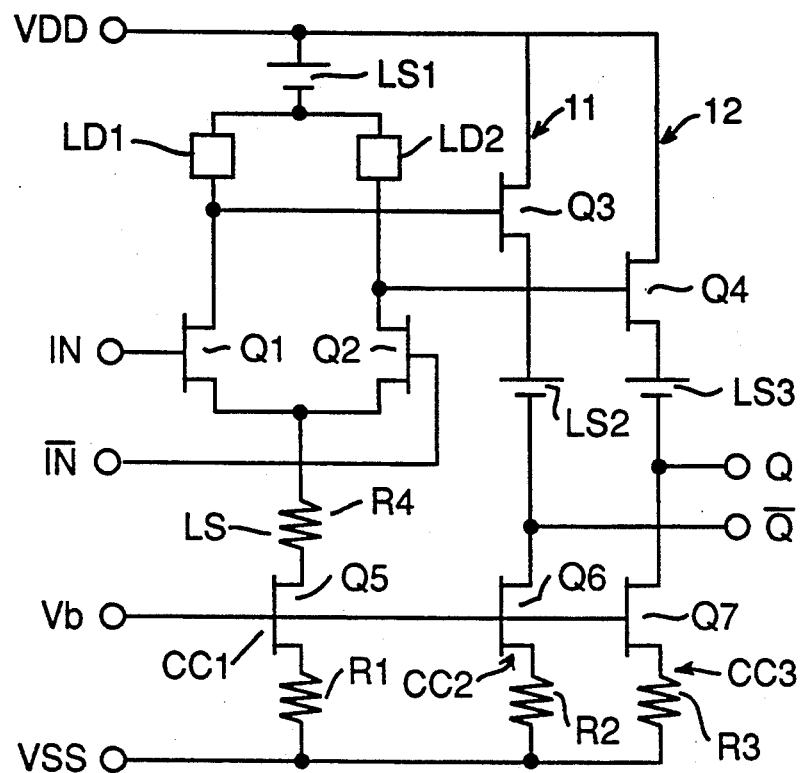
FIG. 5 is a circuit diagram showing another embodiment of the invention.

Moreover, a resistor R4 may be used as the level shift element as shown in FIG. 5. Further, a constant reference voltage may be applied to the gate electrode of one of the transistors Q1 and Q2.

The advantages of the invention, i.e., (i) a reduction in current consumption, and (ii) an efficiency at which leakage of current is kept less than 1%, will now be explained with reference to an example.

Where a buffer circuit whose consumption current is 100 μA is used, if the noise reduction element is not employed, a leakage current of 4–5 μA (4–5%) will be created disadvantageously. At this time, the voltage VGD between the gate and drain is 2.6–7V.

On the other hand, if two diodes are employed as a noise reduction element between the source and drain in the above circuit, a voltage drop of 0.7V is caused by one diode, and hence a voltage drop in the buffer circuit is 1.4V, thereby reducing the voltage VGD between the gate and drain to 1.2–3V. Accordingly, leakage or current can be restrained to 1 μA or less (1% or less), which does not affect the function of the buffer circuit.

With regard to a reduction in current consumption, the consumption is approximately 2.2 mA when the diodes are not employed, whereas it is restrained to 1.1–2 mA when they are employed.

Figure 4A:
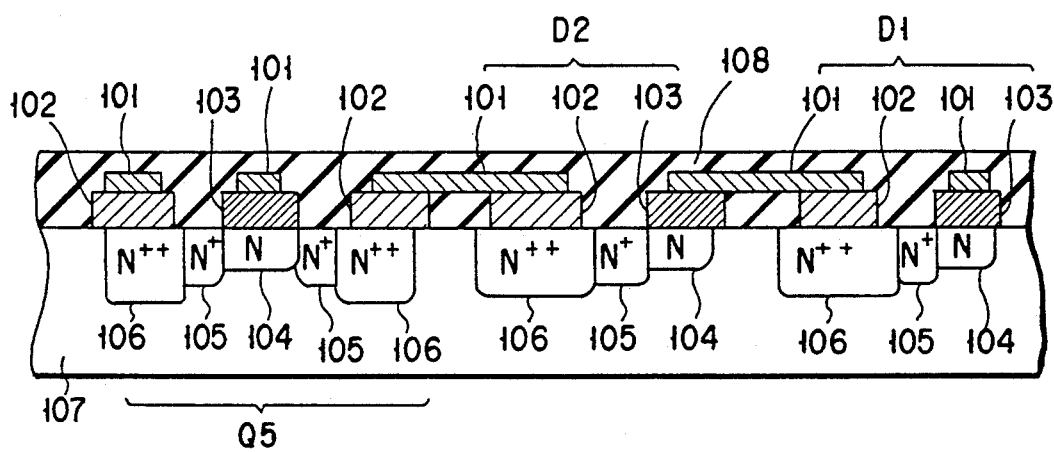
FIG. 4A is a sectional view of the embodiment of FIG. 1.
Figure 4B:
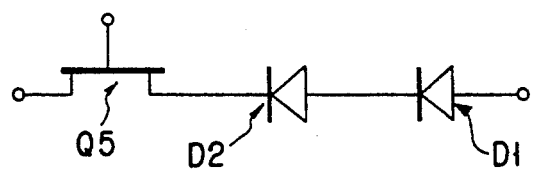
FIG. 4B is a circuit diagram of the embodiment of FIG. 1.

FIG. 4A shows a cross section of part of the embodiment of the invention, in which reference numeral 101 denotes interconnection layers, reference numeral 102 electrodes made of ohmic metal, reference numeral 103 gate electrodes, reference numeral 104 activated layers, reference numeral 105 implanted layers of intermediate density, reference numeral 106 implanted layers of low resistance, reference numeral 107 a semi-insulating GaAs substrate, and reference numeral 108 an insulating layer. FIG. 4B shows that part of the buffer circuit which corresponds to the cross section of FIG. 4A. Like reference numerals denote like elements. As can be understood from FIG. 4B, the FET Q5 and diodes D1 and D2 of a LDD structure is formed on the GaAs.

As is described above, in the invention, a voltage applied to the constant current source can be restrained, thereby reducing current consumption. Further, current flowing from the drain of a FET, serving as a constant current source, to the gate thereof can be restrained, resulting in a reduction in noise and current consumption.

Additional advantages and modifications will readily occur to those skilled in the art. Therefore, the invention in its broader aspects is not limited to the specific details, and representative devices, shown and described herein. Accordingly, various modifications may be made without departing from the spirit or scope of the general inventive concept as defined by the appended claims and their equivalents.

What is claimed is:

1. A buffer logic circuit having a lightly doped drain structure, comprising:

a power source potential;

a ground potential;

first and second field effect transistors (FETs) having drain electrodes, the first FET having a gate electrode supplied with a first input signal and the second FET having a gate electrode supplied with a second input signal, and the first and second FETs having source electrodes being connected to each other, wherein the drain electrodes of the first and second FETs generate output signals corresponding to the first and second input signals, respectively;

a first electric load having an end connected to the drain of the first FET and another end connected to the power source potential; and a second load having an end connected to the drain of the second FET and another end connected to the power source potential; and means, coupled between the source electrodes of the first and second FETs and the ground potential, for supplying a constant-current regulated power supply; and means, coupled between the source electrodes of the first and second FETs and the constant-current regulated power supply means, for reducing a potential of the constant-current regulated power supply means.

2. A buffer logic circuit according to claim 1, wherein the buffer logic circuit is formed on a substrate including GaAs.

3. A buffer logic circuit according to claim 1, wherein the potential-reducing means includes Schottky diodes.

4. A buffer logic circuit according to claim 1, wherein the potential-reducing means includes a resistor.

5. A buffer logic circuit according to claim 1, wherein the constant-current regulated power supply means includes a third FET having a drain electrode, wherein the potential-reducing means reduces a potential of the drain electrode of the third FET.

6. A buffer logic circuit according to claim 1, wherein the first and second FETs are MESFETs.

7. A buffer logic circuit according to claim 1, wherein the first and second FETs are junction-type FETs.

8. A buffer logic circuit according to claim 1, wherein the gate electrode of the second FET is supplied with an inverted level of the first input signal

* * * * *